(12) United States Patent
Adams et al.

(10) Patent No.: US 8,941,177 B2
(45) Date of Patent: Jan. 27, 2015

(54) SEMICONDUCTOR DEVICES HAVING DIFFERENT GATE OXIDE THICKNESSES

(75) Inventors: Charlotte DeWan Adams, Poughkeepsie, NY (US); Michael P. Chudzik, Danbury, CT (US); Siddarth A. Krishnan, Peekskill, NY (US); Unoh Kwon, Fishkill, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 13/534,012

(22) Filed: Jun. 27, 2012

(65) Prior Publication Data
US 2014/0001575 A1 Jan. 2, 2014

(51) Int. Cl.
*H01L 29/36* (2006.01)
*H01L 29/66* (2006.01)

(52) U.S. Cl.
CPC .... *H01L 29/66545* (2013.01); *H01L 29/66795* (2013.01)
USPC .... 257/347; 257/329; 257/407; 257/E21.499; 257/E27.111; 257/E29.136

(58) Field of Classification Search
CPC .................. H01L 29/66545; H01L 29/66795; H01L 29/66818
USPC .......... 257/329, 347, 401–409, E21.409, 631, 257/27.111, 29.136
See application file for complete search history.

(56) References Cited

U.S. PATENT DOCUMENTS

| | | | |
|---|---|---|---|
| 5,480,828 A | 1/1996 | Hsu et al. | |
| 5,595,922 A | 1/1997 | Tigelaar et al. | |
| 5,677,218 A | 10/1997 | Tseng | |
| 5,918,116 A | 6/1999 | Chittipeddi | |
| 5,920,779 A | 7/1999 | Sun et al. | |
| 6,133,164 A | 10/2000 | Kim | |
| 6,271,094 B1 | 8/2001 | Boyd et al. | |
| 6,284,580 B1 | 9/2001 | Takehiro | |
| 6,335,262 B1 | 1/2002 | Crowder et al. | |
| 6,406,945 B1 | 6/2002 | Lee et al. | |
| 6,686,231 B1 | 2/2004 | Ahmed et al. | |
| 6,815,268 B1 | 11/2004 | Yu et al. | |
| 6,833,308 B2 | 12/2004 | Ahn et al. | |
| 7,084,018 B1 * | 8/2006 | Ahmed et al. | 438/156 |
| 7,312,502 B2 | 12/2007 | Clark, Jr. et al. | |
| 7,378,357 B2 | 5/2008 | Clark, Jr. et al. | |
| 7,943,457 B2 | 5/2011 | Chudzik et al. | |
| 8,084,346 B1 | 12/2011 | Guo et al. | |
| 8,102,006 B2 | 1/2012 | Zhou | |

(Continued)

*Primary Examiner* — Michael Lebentritt
(74) *Attorney, Agent, or Firm* — L. Jeffrey Kelly; H. Daniel Schnurmann

(57) ABSTRACT

A method of manufacturing multiple finFET devices having different thickness gate oxides. The method may include depositing a first dielectric layer on top of the semiconductor substrate, on top of a first fin, and on top of a second fin; forming a first dummy gate stack; forming a second dummy gate stack; removing the first and second dummy gates selective to the first and second gate oxides; masking a portion of the semiconductor structure comprising the second fin, and removing the first gate oxide from atop the first fin; and depositing a second dielectric layer within the first opening, and within the second opening, the second dielectric layer being located on top of the first fin and adjacent to the exposed sidewalls of the first pair of dielectric spacers, and on top of the second gate oxide and adjacent to the exposed sidewalls of the second pair of dielectric spacers.

10 Claims, 15 Drawing Sheets

CROSS SECTION A - A

(56) References Cited

U.S. PATENT DOCUMENTS

| | | | |
|---|---|---|---|
| 8,546,209 B1* | 10/2013 | Cheng et al. | 438/183 |
| 8,748,959 B2* | 6/2014 | Van Buskirk et al. | 257/296 |
| 2005/0110085 A1 | 5/2005 | Zhu et al. | |
| 2005/0224880 A1* | 10/2005 | Lee et al. | 257/347 |
| 2005/0269644 A1 | 12/2005 | Brask et al. | |
| 2008/0061370 A1* | 3/2008 | Matsuo | 257/347 |
| 2012/0315732 A1* | 12/2012 | Kang et al. | 438/197 |
| 2013/0200468 A1* | 8/2013 | Cai et al. | 257/401 |
| 2014/0027783 A1* | 1/2014 | Yin et al. | 257/77 |
| 2014/0124873 A1* | 5/2014 | Jagannathan et al. | 257/407 |

* cited by examiner

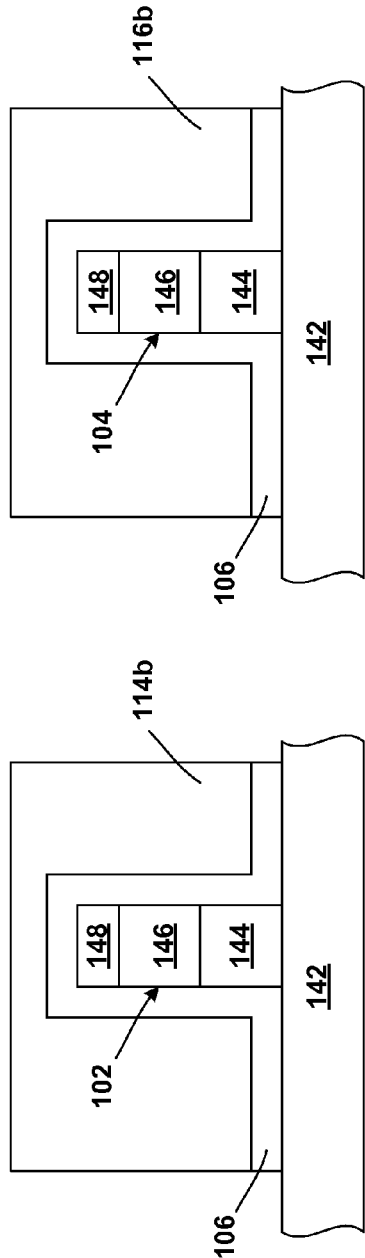
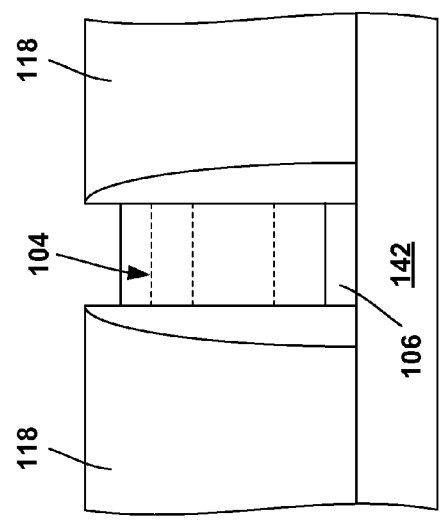
FIG. 8
CROSS SECTION A - A
FIG. 9
CROSS SECTION B - B

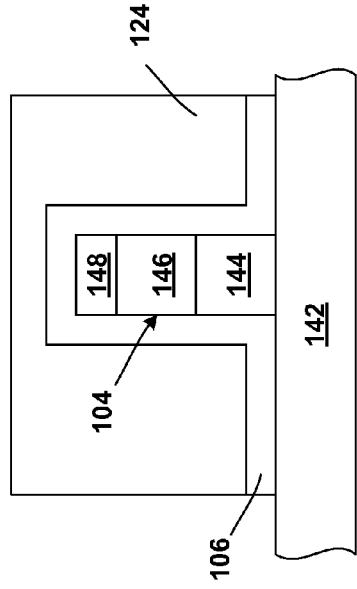
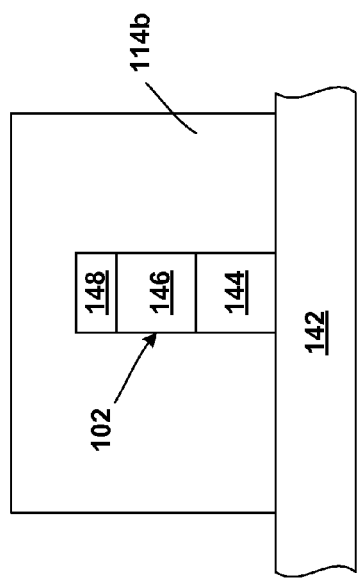
FIG. 11
CROSS SECTION C - C
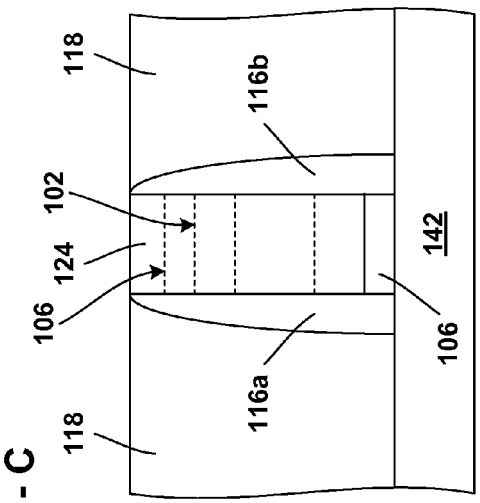
FIG. 12
CROSS SECTION D - D
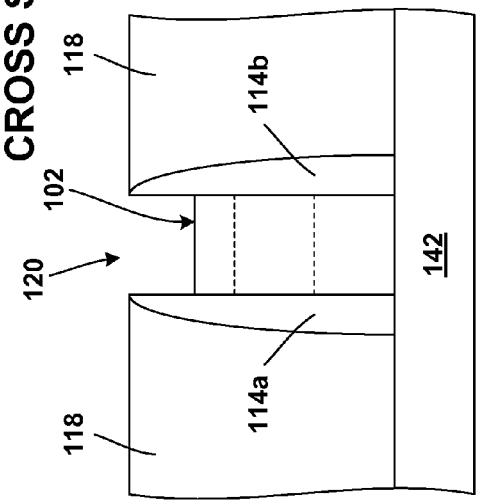
FIG. 13
CROSS SECTION E - E

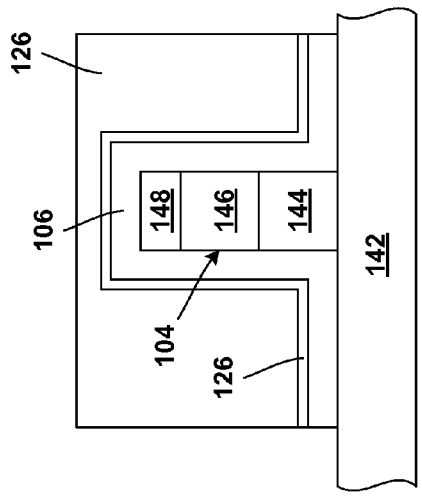
FIG. 15 CROSS SECTION F - F
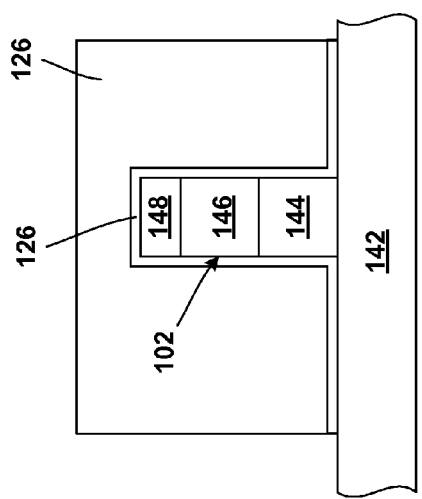
FIG. 16 CROSS SECTION G - G
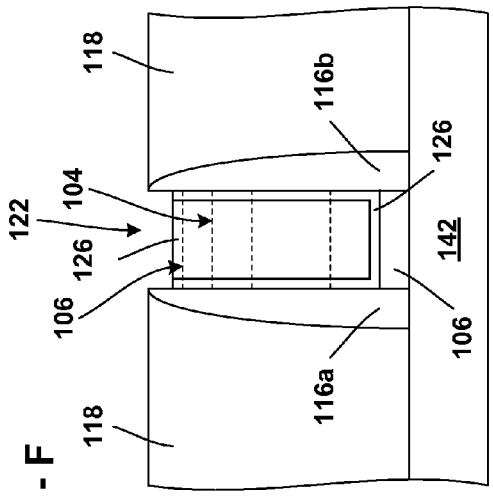
FIG. 17 CROSS SECTION H - H

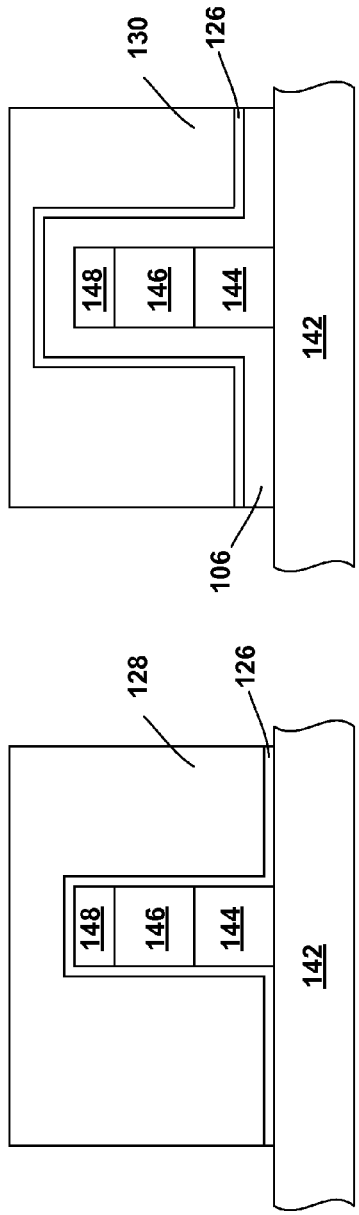
FIG. 19
CROSS SECTION I - I
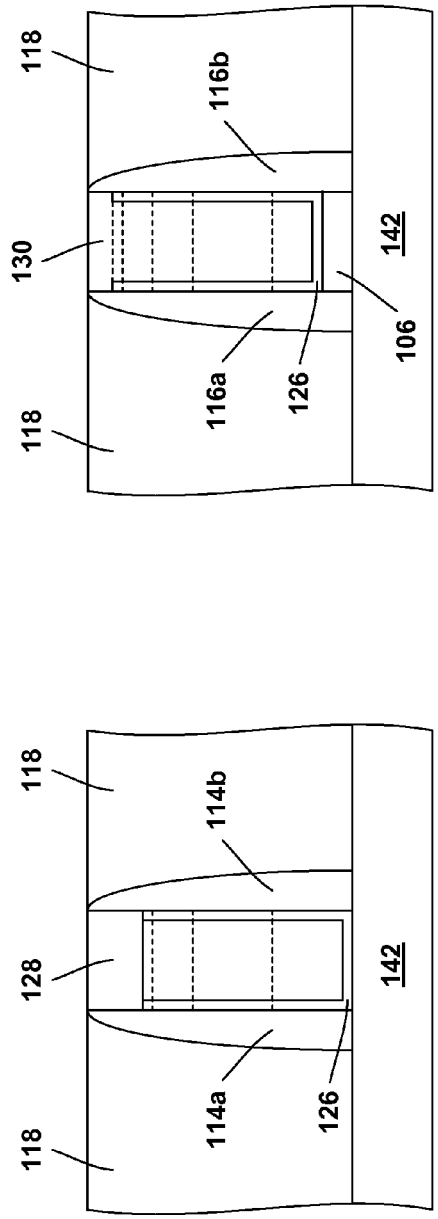
FIG. 20
CROSS SECTION J - J
FIG. 21
CROSS SECTION K - K

SEMICONDUCTOR DEVICES HAVING DIFFERENT GATE OXIDE THICKNESSES

FIELD OF THE INVENTION

The present disclosure generally relates to integrated circuits, and more particularly to fabricating semiconductor devices having different thickness gate oxides on the same semiconductor substrate.

BACKGROUND OF INVENTION

An increasing demand exists for providing semiconductor devices having gate oxide layers of varying thicknesses, for example field effect transistors (FET). In fact, the gate oxide thickness is a major concern in terms of reliability when providing integrated circuit devices containing transistors and other circuit elements that operate at differing voltage levels. By way of example, a relatively thin gate oxide may typically range from 8 Å to 20 Å in thickness, while a relatively thick gate oxide may typically range from 12 Å to 60 Å in thickness.

Device scaling trends have led to low voltage operation with relatively thin gate oxide; whereas, some circuit applications still require a relatively thick gate oxide, such as driver or receiver circuitry at the chip I/O, and some analog output devices. The thick gate oxide is necessary for high voltage devices in order to ensure reliability, while the thin gate oxide is desirable for the relatively fast logic devices that use low voltages at the gate. Use of relatively thick gate oxide for the lower voltage transistors cause poor device performance and significantly decrease the speed, therefore the need for multiple thickness gate oxides.

Moreover, with the trend of trying to put as many different circuits as possible in the same chip to achieve more functionality and improved performance (such as Merged logic-DRAM, embedded NVM micro-controls), there are even more different possible combinations for different parts of circuits in the same chip to have different gate oxide thickness to achieve the optimized performance and reliability at the system level.

Referring to FIG. 22, typical fabrication of a semiconductor device, such as a planar FET, includes oxidizing a surface of a substrate 202 to form a dielectric layer. The oxidized dielectric layer may be referred to as a grown dielectric layer. Next, a layer of polysilicon may be deposited on top of the grown dielectric layer. The grown dielectric layer and the polysilicon layer are patterned and etched to form dummy gate stacks. Each dummy gate stack has a gate oxide made from the grown dielectric layer. The gate oxides may a common thickness. Also, each gate stack includes a dummy gate (not shown) made from the polysilicon layer.

After etching the gate stacks spacers 210a, 210b, 216a, 216b may be formed on opposite sides of each dummy gate stack as shown in the figure. Next, an inter layer dielectric (ILD) material 204 may be disposed between the devices to electrically insulate one device from another. The ILD 204 may be polished preferably using a chemical and mechanical polishing (CMP) process to expose the tops of the dummy gates stacks. The exposed polysilicon dummy gates (note shown) may then be removed using an etching process and are typically replaced with a metal gate terminal 208, 214. The dummy gates may be replaced with a metal or any other semiconducting material known to a person of ordinary skill in the art. Alternatively, the entire dummy gate stack including the polysilicon dummy gate and the gate oxide may be removed with an etching technique and replaced with a high-k dielectric and metal gate terminal. This technique may be referred to as replacement gate (RG) or gate-last processing.

During the RG processing there exists a potential for the thickness of the gate oxide to be compromised by the etching process during the removal of the polysilicon dummy gate in preparation for depositing a gate terminal 208, 214. The thickness of the gate oxide may be harmed by either the etchants used to remove the polysilicon dummy gates or a post etching process, typically RIE, used to clean and remove polymers attacking the underlying gate oxide 206.

Further, to fabricate different gate oxide thicknesses (e.g. 206 and 212) on the same semiconductor substrate an additional iteration of the process described above (oxidize-mask-etch) is required for each additional thickness desired. However, such an approach typically significantly increases the overall manufacturing cost and degrades the reliability as well as yield due to the potential contamination caused by resist residues from the patterning required. Besides, controlling the gate oxide thickness is more difficult because the thick oxide layer results from the combination of multiple oxide formation cycles, and it may be damaged by the etching process described above. This introduces multiple sources of variability due to the multiple steps required to fabricate the thick gate oxide layers. Additionally, the oxidize-mask-etch process described above may cause ILD loss because the ILD remains unprotected during processing. An unprotected ILD can have recesses that fill with Al or other metals during replacement gate processing. Excess metal collected in these recesses can lead to a short circuit.

A similar RG technique may be used to fabricate finFET devices. Fabrication of finFET devices using RG techniques includes patterning and etching fins into a semiconductor substrate. The semiconductor substrate may include any bulk substrate or SOI substrate know to a person of ordinary skill in the art. A first gate dielectric may be grown on the fins by oxidizing the surface of the semiconductor substrate. The process of growing the first gate dielectric includes oxidizing the surface of the semiconductor substrate. This process consumes some of the semiconductor material in effect reducing the width of the fins. Next, a polysilicon layer may be deposited on top of the gate dielectric layer from which dummy gates may be pattered and etched. After etching, a portion of the gate dielectric may remain beneath the dummy gates, and the dummy gate and gate dielectric form dummy gate stacks. A pair of spacers may be disposed on opposite sidewalls of each dummy gate stacks. The dummy gates may then be removed to create openings. Some openings may be masked while others may remain open. A second gate dielectric may be grown on top of the first gate dielectric in the unmasked openings. Next, the mask may be removed and metal gate terminals may be formed in the openings between the spacers and on top of the first gate dielectric and the second gate dielectric.

SUMMARY

According to one embodiment of the present disclosure, a method of manufacturing a semiconductor structure including multiple finFET devices each including different thickness gate oxides and formed in a semiconductor substrate is provided. The method may include depositing a first dielectric layer on top of the semiconductor substrate, on top of a first fin, and on top of a second fin, forming a first dummy gate stack including a first dummy gate located on top of a first gate oxide above the first fin, and a first pair of dielectric spacers disposed on opposite sides of the first dummy gate stack, and forming a second dummy gate stack including a second dummy gate located on top of a second gate oxide above the second fin, and a second pair of dielectric spacers disposed on opposite sides of the second dummy gate stack. The method may also include removing the first dummy gate and the second dummy gate selective to the first and second gate oxides, and creating a first opening defined by exposed sidewalls of the first pair of dielectric spacers and a second opening defined by exposed sidewalls of the second pair of dielectric spacers, masking a portion of the semiconductor structure including the second fin, and removing the first gate oxide from atop the first fin, and depositing a second dielectric layer within the first opening, and within the second opening, the second dielectric layer being located on top of the first fin and adjacent to the exposed sidewalls of the first pair of dielectric spacers, the second dielectric layer being located on top of the second gate oxide and adjacent to the exposed sidewalls of the second pair of dielectric spacers.

According another exemplary embodiment, a semiconductor structure including multiple finFET devices each including different thickness gate oxides and formed in a semiconductor substrate is provided. The structure may include a semiconductor substrate including a first fin and a second fin, a first gate stack including a first terminal located above the first fin, and a first pair of dielectric spacers disposed on opposite sides of the first gate stack, the first gate stack including a dielectric layer located between the first fin and the gate terminal and between the gate terminal and the pair of spacers, and a second gate stack including a gate oxide and a second terminal located above the second fin, and a second pair of dielectric spacers disposed on opposite sides of the second gate stack, the gate oxide being located on top of the second fin and the gate terminal being located on top of the gate oxide, the second gate stack including the dielectric layer located between the gate oxide and the gate terminal and between the gate terminal and the pair of spacers.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIGS. 1-21 illustrate the steps of a method of fabricating a semiconductor structure according to one embodiment.

FIG. 1 depicts an isometric view of a first and a second fin formed in a semiconductor substrate according to one embodiment.

FIG. 2 depicts the deposition of a first dielectric layer according to one embodiment.

FIG. 3 depicts the deposition of a sacrificial layer according to one embodiment.

FIG. 4 depicts the formation of dummy gates according to one embodiment.

FIG. 5 depicts the formation of spacers on opposite sides of the dummy gates according to one embodiment.

FIG. 6 depicts the deposition of an inter-layer dielectric formed on top of the semiconductor substrate and surrounding the dummy gates according to one embodiment.

FIG. 7 depicts the removal of the dummy gates according to one embodiment.

FIG. 8 depicts cross-sectional view A-A of FIG. 7, in which the dummy gates are removed.

FIG. 9 depicts cross-sectional view B-B of FIG. 7, in which the dummy gates are removed.

FIG. 10 depicts the deposition of a resist mask on top of the first dielectric layer above the second fin and the subsequent removal of the first dielectric layer from atop the first fin according to one embodiment.

FIG. 11 depicts cross-sectional view C-C of FIG. 10, in which the first dielectric layer is removed from atop the first fin.

FIG. 12 depicts cross-sectional view D-D of FIG. 10, in which the first dielectric layer is removed from atop the first fin.

FIG. 13 depicts cross-sectional view E-E of FIG. 10, in which the first dielectric layer is removed from atop the first fin.

FIG. 14 depicts the deposition of a second dielectric layer on top of the first fin and on top of the first dielectric layer above the second fin according to one embodiment.

FIG. 15 depicts cross-sectional view F-F of FIG. 14, in which the second dielectric layer is deposited on top of the first fin and on top of the first dielectric layer above the second fin.

FIG. 16 depicts cross-sectional view F-F of FIG. 14, in which the second dielectric layer is deposited on top of the first fin and on top of the first dielectric layer above the second fin.

FIG. 17 depicts cross-sectional view F-F of FIG. 14, in which the second dielectric layer is deposited on top of the first fin and on top of the first dielectric layer above the second fin.

FIG. 18 depicts the deposition of gate terminals on top of the second dielectric layer according to one embodiment.

FIG. 19 depicts cross-sectional view I-I of FIG. 18, in which gate terminals are formed on top of the second dielectric layer.

FIG. 20 depicts cross-sectional view I-I of FIG. 18, in which gate terminals are formed on top of the second dielectric layer.

FIG. 21 depicts cross-sectional view I-I of FIG. 18, in which gate terminals are formed on top of the second dielectric layer.

DETAILED DESCRIPTION

Figure 1:
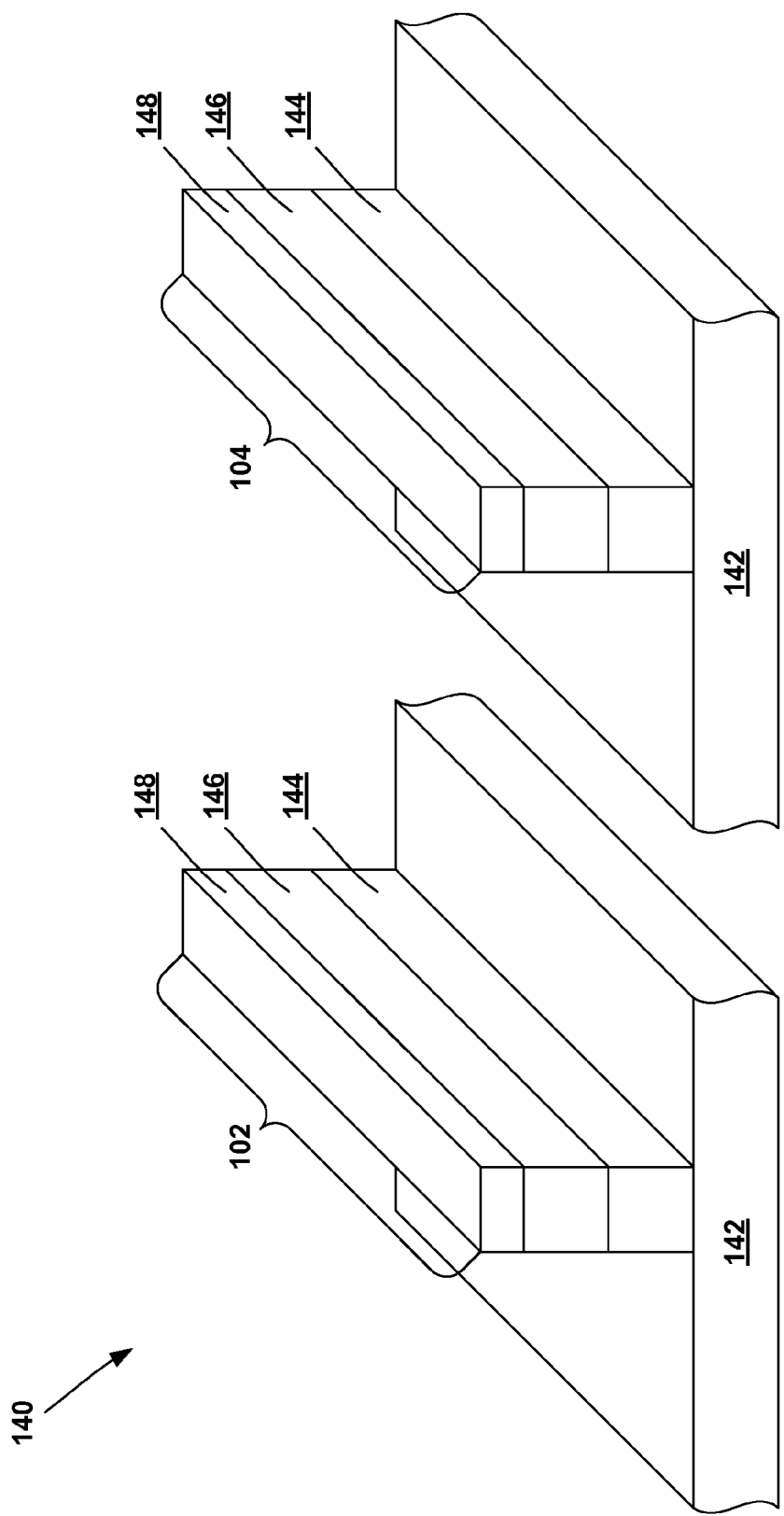

Detailed embodiments of the claimed structures and methods are disclosed herein; however, it can be understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only typical embodiments of the invention. In the drawings, like numbering represents like elements.

A finFET device includes a plurality of fins formed in a wafer; a gate covering a portion of the fins, wherein the portion of the fins covered by the gate serves as a channel region of the device and portions of the fins extending out from under the gate serve as source and drain regions of the device; and spacers on opposite sides of the gate.

In a RG fabrication approach, a semiconductor substrate may be patterned and etched to form fins. Next, a dummy gate may be formed in a direction perpendicular to the length of the fins. For example, the dummy gate may be pattered and etched from a polysilicon layer. A pair of spacers can be disposed on opposite sidewalls of the dummy gate. Later, the dummy gate may be removed from between the pair of spacers, as by, for example, an anisotropic vertical etch process such as a reactive ion etch (RIE). This creates an opening between the spacers where a metal gate may then be formed between the spacers. A gate dielectric may be configured below the metal gate. Devices may include gate dielectrics with different thicknesses. Formation of multiple finFET devices having different thickness gate dielectrics using RG fabrication techniques is described in greater detail below.

Referring now to FIGS. 1-15, exemplary process steps of forming FETs, such as finFETs, having different thickness gate oxides on a single semiconductor integrated circuit in accordance with one embodiment of the present invention are shown. In particular, a high performance finFET device may have a thin gate oxide, and an I/O finFET device may have a thick gate oxide. Standard replacement gate (RG) processing techniques, as described above, may be used to form both high performance finFET devices and I/O finFET devices. The particular process point in which the gate oxide layers are formed during standard RG processing may vary. These variations are described in detail below as different embodiments.

Referring now to FIG. 1, a first fin 102 and a second fin 104 are shown formed in an SOI substrate. It should be noted that the fins 102 and 104 may be formed in any semiconductor substrate know to a person having ordinary skill in the art. The first fin 102 depicts the beginning stages of the fabrication of a single high performance device while the second fin 104 depicts the beginning stages of the fabrication of a single I/O device. It should be noted that a single integrated circuit may include multiple high performance devices and multiple I/O devices. Conventional photolithography techniques known to a person having ordinary skill in the art may be used to form the fins 102, 104 in the SOI substrate.

With continued reference to FIG. 1, a silicon-on-insulator (SOI) substrate 140 is shown. The SOI substrate 140 may include a buried oxide (BOX) layer 142 and a silicon-on-insulator (SOI) layer 144 formed on top of the BOX layer 142. In one embodiment, the SOI substrate 140 may have an oxide layer 146 and a nitride layer 148 formed on a top surface of the SOI layer 144, where the nitride layer 148 may be located directly on top of the oxide layer 146.

The BOX layer 142 may be formed from any of several dielectric materials. Non-limiting examples include, for example, oxides, nitrides and oxynitrides of silicon. The BOX layer 142 may also include oxides, nitrides and oxynitrides of elements other than silicon. In addition, the BOX layer 142 may include crystalline or non-crystalline dielectric material. Moreover, the BOX layer 142 may be formed using any of several methods. Non-limiting examples include ion implantation methods, thermal or plasma oxidation or nitridation methods, chemical vapor deposition methods and physical vapor deposition methods. The BOX layer 142 may include a thickness ranging from about 5 nm to about 200 nm. In one embodiment, the BOX layer 142 may be about 25 nm thick.

The SOI layer 144 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically, the SOI layer 144 includes a thickness ranging from about 5 nm to about 100 nm. Methods for making the SOI layer 144 are well known in the art. Non-limiting examples include SIMOX (Separation by Implantation of OXygen), wafer bonding, and ELTRAN® (Epitaxial Layer TRANsfer).

The oxide layer 146 may include a silicon oxide or a silicon oxynitride. In one embodiment, the oxide layer 146 can be formed, for example, by thermal or plasma conversion of a top surface of the SOI layer 144 into a dielectric material such as silicon oxide or silicon oxynitride. In one embodiment, the oxide layer 146 can be formed by deposition of silicon oxide or silicon oxynitride by chemical vapor deposition (CVD) or atomic layer deposition (ALD). The oxide layer 146 may have a thickness ranging from about 1 nm to about 10 nm, although a thickness less than 1 nm and greater than 10 nm may be acceptable. In one embodiment, the oxide layer 146 may be about 5 nm thick.

The nitride layer 148 may include an insulating material such as, for example, silicon nitride. The nitride layer 148 may be formed using conventional deposition methods, for example, low-pressure chemical vapor deposition (LPCVD). In one embodiment, the nitride layer 148 may have a thickness ranging from about 5 nm to about 100 nm. In one particular embodiment, the nitride layer 148 may be about 50 nm thick.

Figure 2:
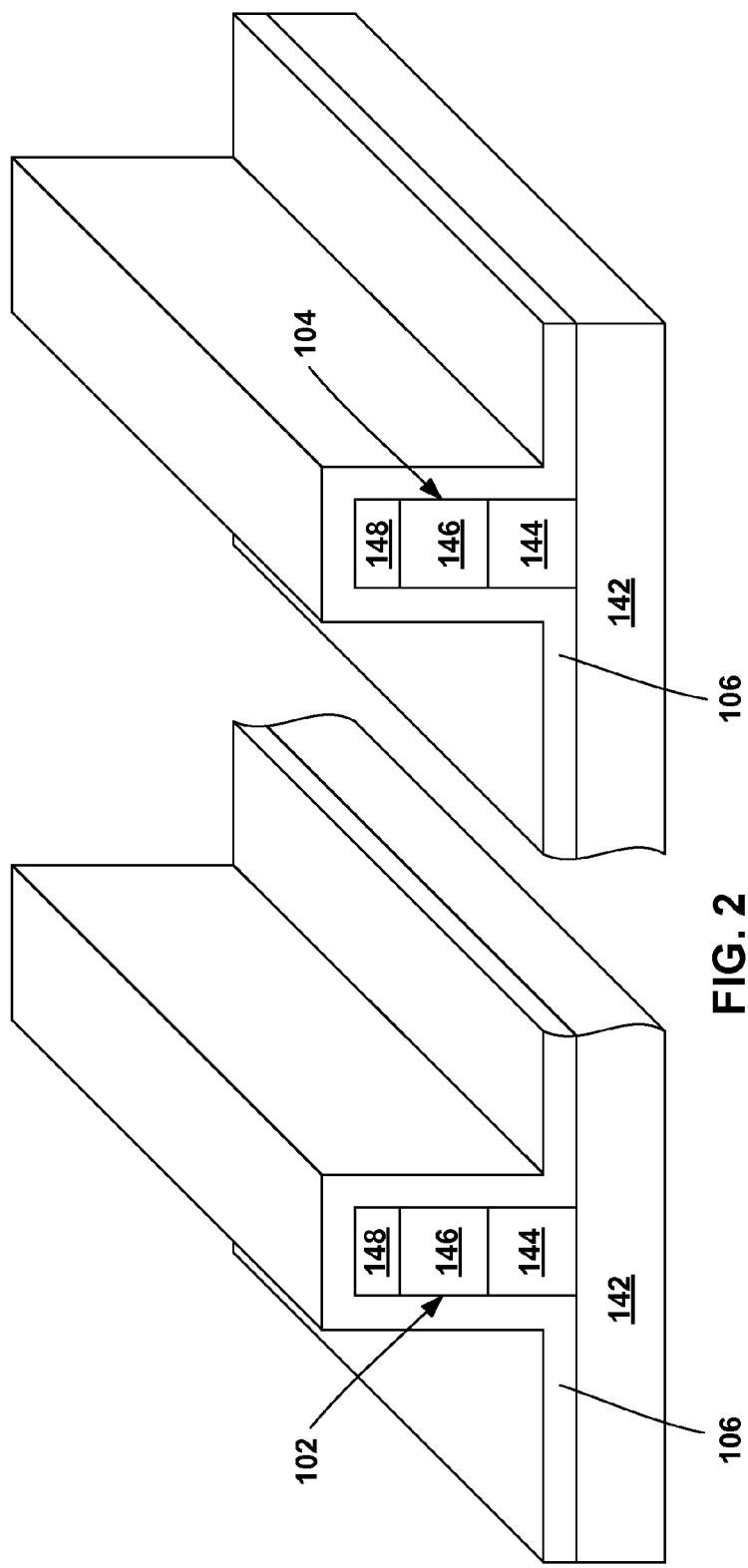

Referring now to FIG. 2, a first dielectric layer 106 may be deposited conformal to the surface of the SOI substrate 140, the first fin 102, and the second fin 104. In one embodiment, the first dielectric layer 106 may include, but is not limited to, a material made from hafnium silicate (HfSiO$_x$), hafnium oxide (HfO$_2$), zirconium silicate (ZrSiO$_x$), zirconium oxide (ZrO$_2$), silicon nitride (Si$_3$N$_4$), silicon oxynitride (SiON), or other high-k material (greater than 4.0) or any combination of these materials. In one embodiment, the first dielectric layer 106 may include silicon oxide (SiO$_2$) deposited using an atomic layer deposition (ALD) technique. The first dielectric layer 106 may have a thickness ranging from about 12 Å to 60 Å, although a thickness of the first dielectric layer 106 less than 12 Å or greater than 60 Å is acceptable.

Figure 3:
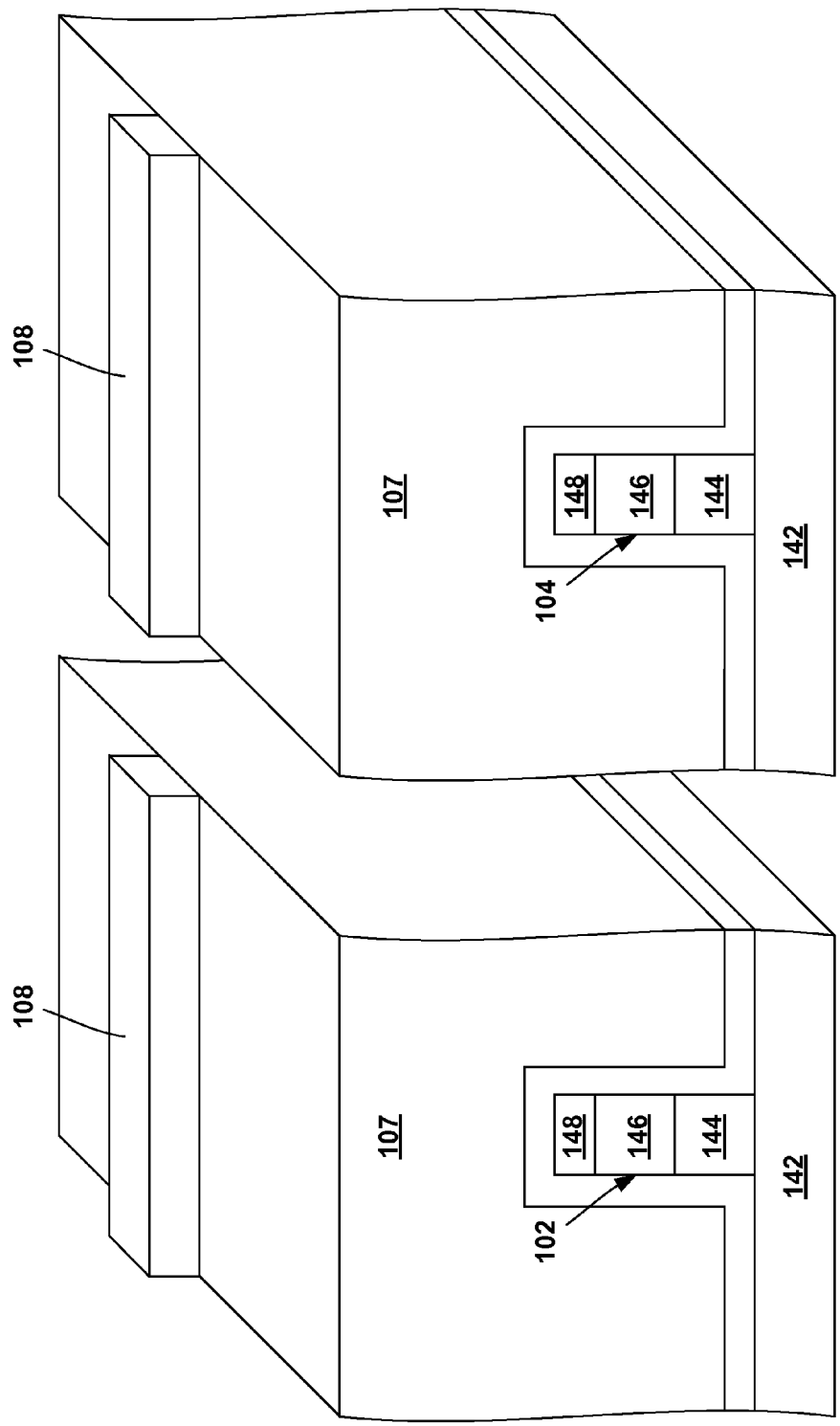

Now referring to FIG. 3, a sacrificial layer 107 is formed on top of the first dielectric layer 106. The sacrificial layer 107 may be used to form dummy gates to be used in conjunction with standard replacement gate processing. The sacrificial layer 107 may be deposited using any suitable technique such as atomic layer deposition (ALD), chemical vapor deposition (CVD), or physical vapor deposition (PVD). In one embodiment, the sacrificial layer 107 may be made from polysilicon. A chemical mechanical polishing (CMP) technique may be used to smooth a top surface of the sacrificial layer 107.

With continued reference to FIG. 3, a first resist mask 108 may be applied to the top surface of the sacrificial layer 107. Conventional photolithography techniques known to a person having ordinary skill in the art may be used to pattern dummy gates (shown in FIG. 4) from the sacrificial layer 107 using the first resist mask 108. Portions of the sacrificial layer 107 and the first dielectric layer 106 not covered by the first resist mask 108 may be removed selective to the BOX layer 142, the first fin 102, and the second fin 104. In one embodiment, for example, reactive ion etching (RIE) may be used to remove the sacrificial layer 107 and the first dielectric layer 106 not covered by the resist mask.

Figure 4:
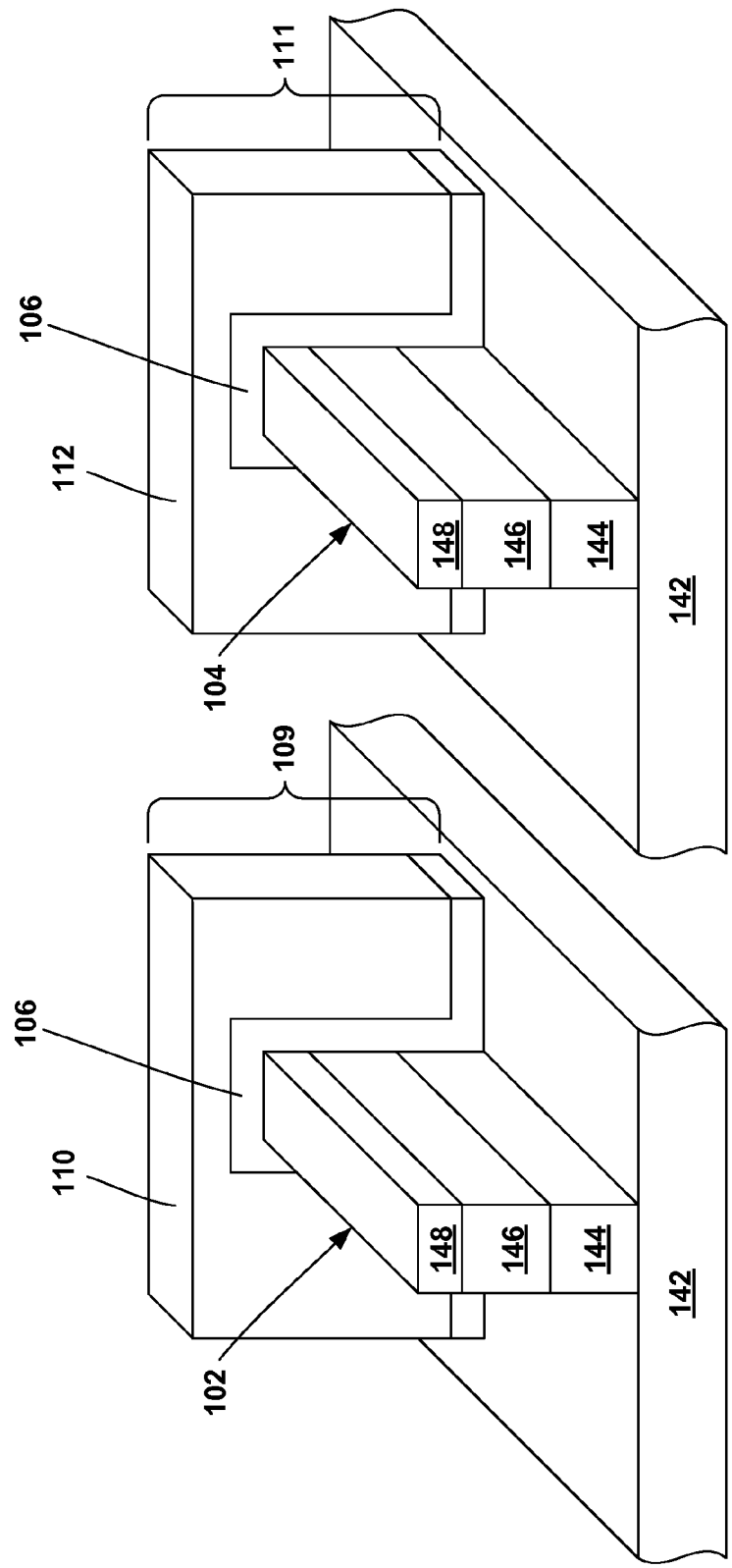

Now referring to FIG. 4, a first gate stack 109 and a second gate stack 111 patterned from the sacrificial layer 107, FIG. 3, and the first dielectric layer 106 are shown. The first resist mask 108, FIG. 3, may be removed after patterning of the first and second gate stacks 109 and 111. The first gate stack 109 may include a first dummy gate 110 and a portion of the first dielectric layer 106. The second gate stack 111 may include a second dummy gate 112 and a portion of the first dielectric layer 106.

Figure 5:
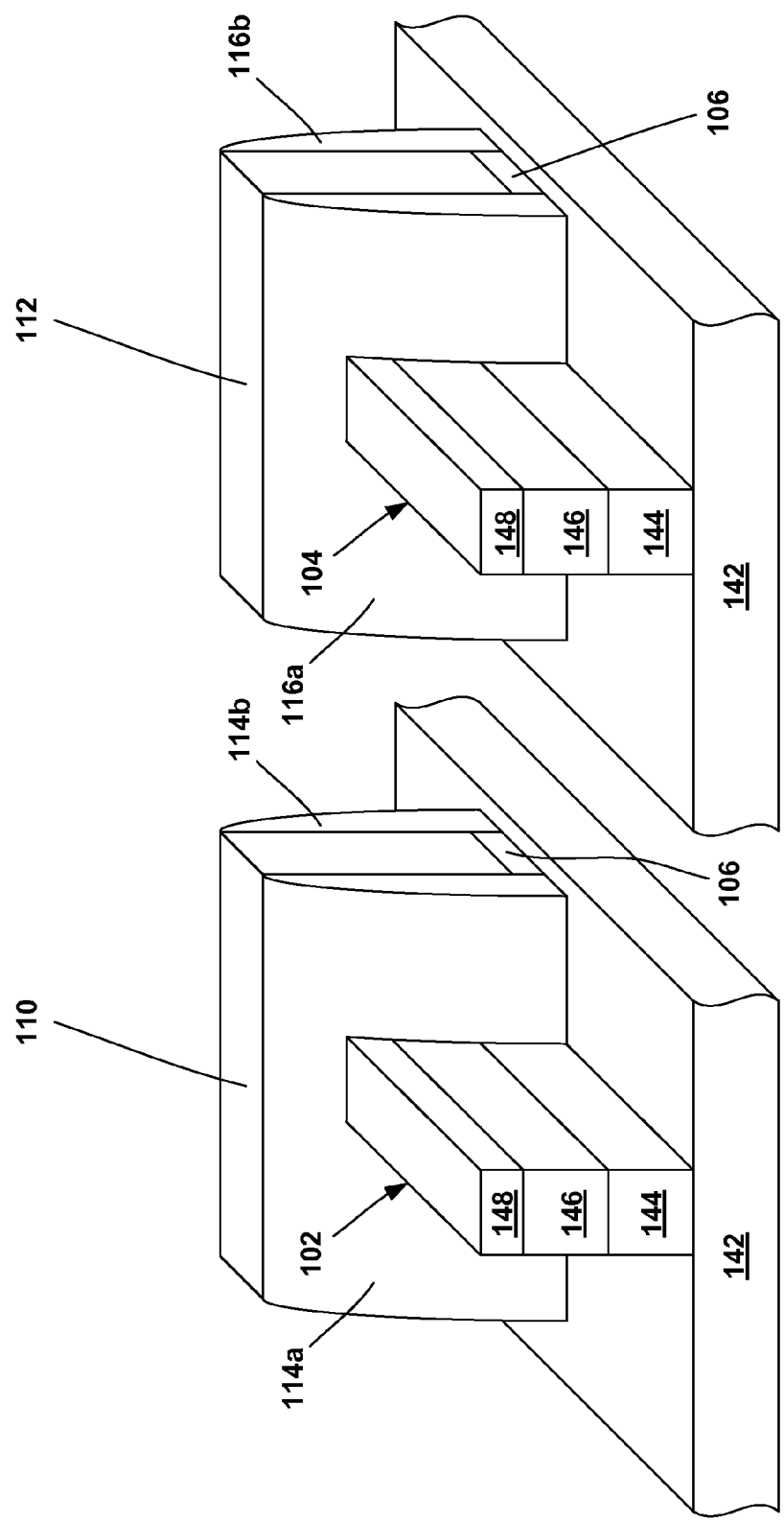

Now referring to FIG. 5, a first pair of dielectric spacers 114a, 114b may be formed on opposite sides of the first dummy gate 110 and a second pair of dielectric spacers 116a, 116b may be formed on opposite sides of the second dummy gate 112. Conventional photolithography techniques known to a person having ordinary skill in the art may be used to form the first pair of dielectric spacers 114a, 114b and the second pair of dielectric spacers 116a, 116b.

Figure 6:
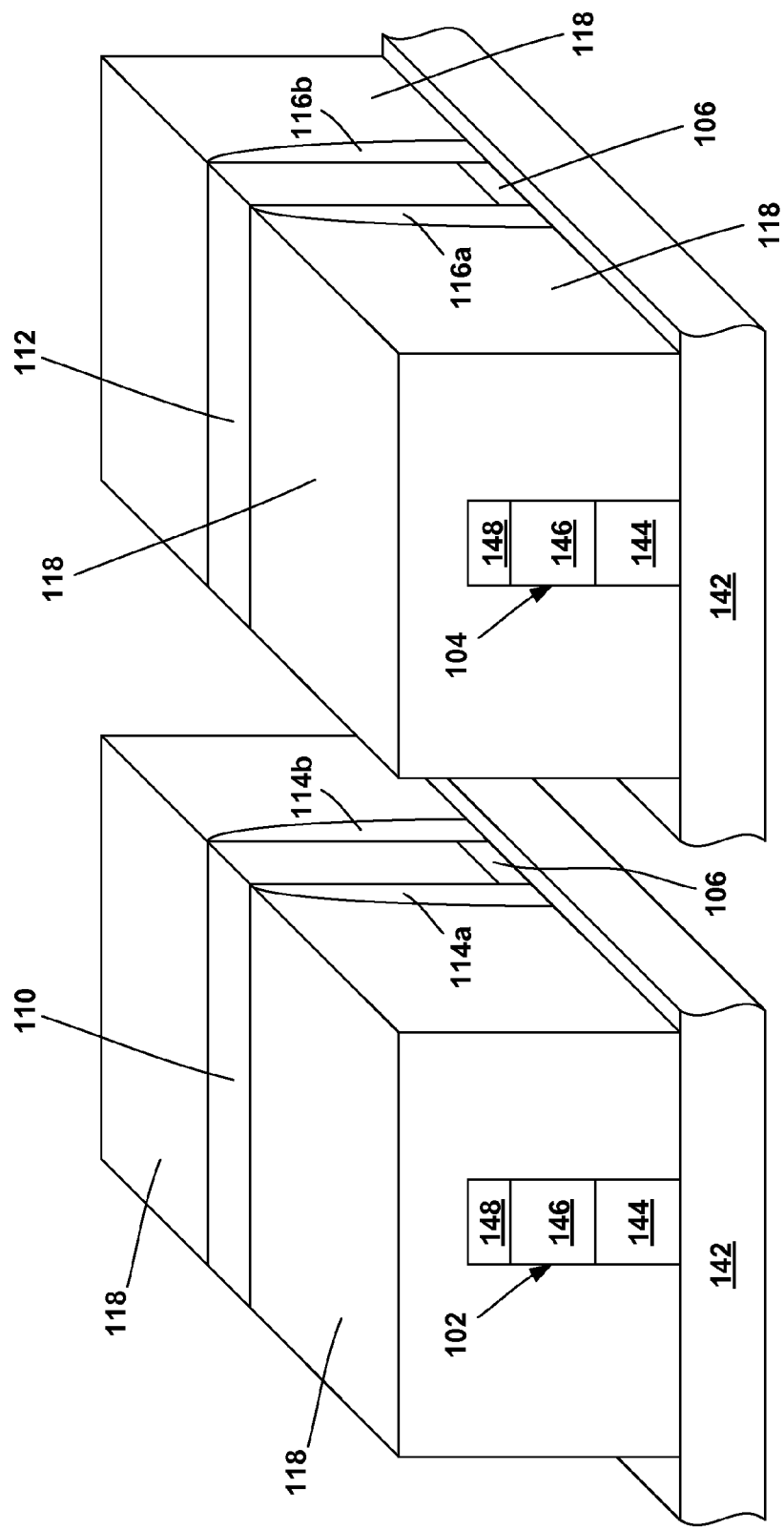

Now referring to FIG. 6, an interlayer dielectric (ILD) material 118, deposited on top of the SOI substrate 140, the first fin 102, the second fin 104, the first pair of spacers 114a, 114b, and the second pair of spacers 116a, 116b, is shown. A CMP technique may be used to smooth a top surface of the ILD material 118, the first dummy gate 110, and the second dummy gate 112.

Figure 7:
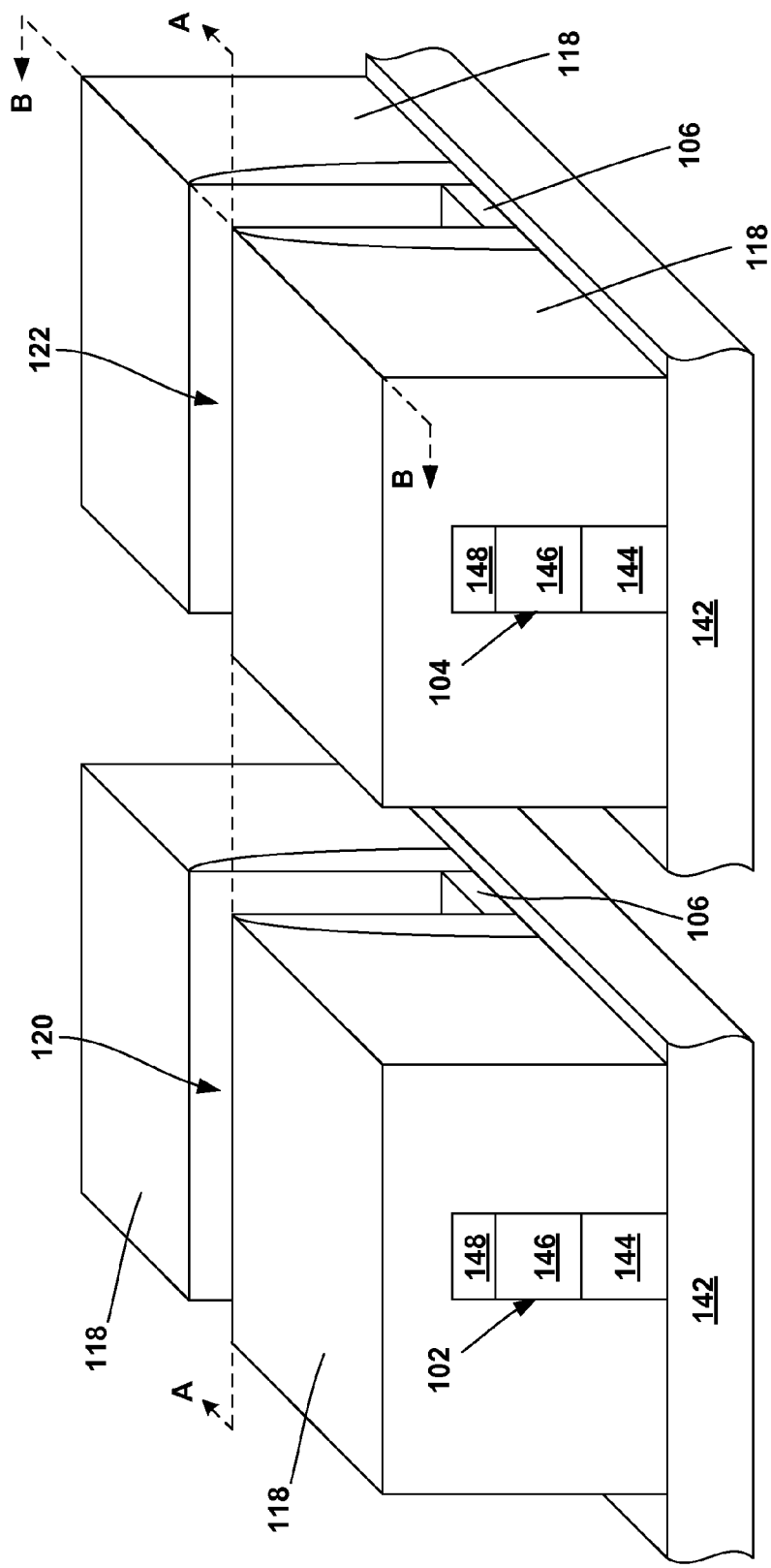

Now referring to FIG. 7, the first dummy gate 110, FIG. 6, and the second dummy gate 112, FIG. 6, may be removed selective to the first dielectric layer 106. In one embodiment, isotropic wet etching may be used to remove the first dummy gate 110, FIG. 6, and the second dummy gate 112, FIG. 6. In one embodiment, the isotropic wet etching technique may use one of the following compounds, tetra methyl ammonium hydroxide (TMAH), warm or hot ammonia, or hot tetra eethyl ammonium hydroxide (TEMH). In on embodiment, the isotropic wet etching technique may use ammonium hydroxide. In one embodiment, for example, reactive ion etching (RIE) may be used to remove the first dummy gate 110, FIG. 6, and the second dummy gate 112, FIG. 6. Removal of the first dummy gate 110, FIG. 6, and the second dummy gate 112, FIG. 6, creates a first opening 120 and a second opening 122, as shown in the figure.

FIGS. 8 and 9 each depict a cross-sectional view of FIG. 7. Cross section A-A is depicted in FIG. 8. Cross section B-B is depicted in FIG. 9. Referring to both FIGS. 8 and 9, the first dielectric layer 106 is shown conformal to the BOX layer 142, the first fin 102, and the second fin 104, but only in the openings 120, 122, FIG. 7, created by the removal of the first dummy gate 110, FIG. 6, and the second dummy gate 112, FIG. 6. Therefore, the first dielectric layer 106 may be deposited conformal to the fins 102, 104 of both the high performance finFET device and the I/O finFET device, as shown in the figure.

Figure 10:
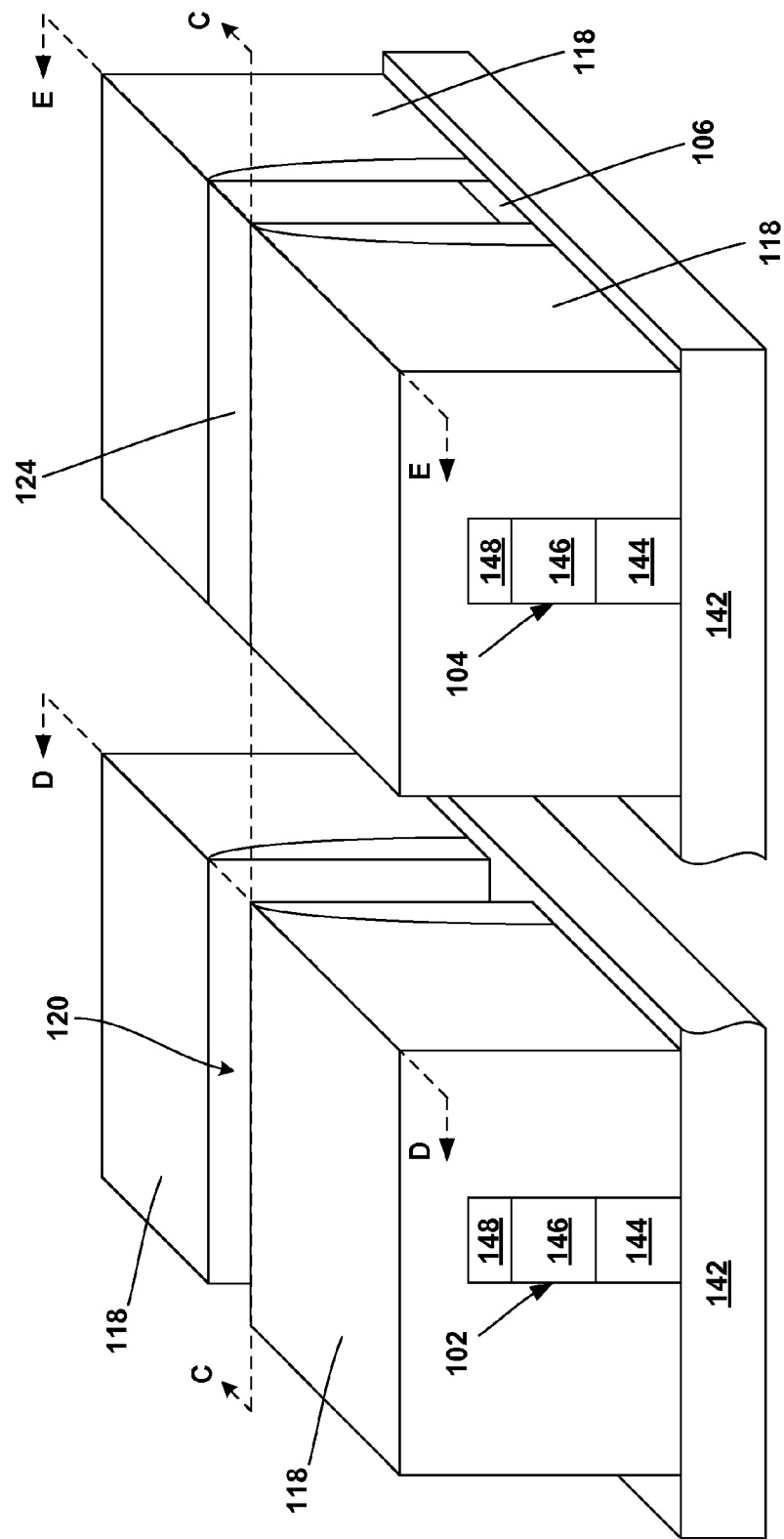

Referring now to FIG. 10, a second resist mask 124 is shown in place of the second dummy gate 112, FIG. 6, in the second opening 122, FIG. 7. After the second dummy gate 112, FIG. 6, is removed the second resist mask 124 may be applied directly on top of the first dielectric layer 106, but only within the second opening 122, FIG. 7. The second resist mask 124 may be not applied on top of the first dielectric layer 106 within the first opening 120. Therefore, the second resist mask 124 may be applied directly on top of the first dielectric later 106 of the I/O finFET device and not on top of the first dielectric layer 106 of the high performance finFET device. The first dielectric layer 106 may then be removed from all areas not protected by the second resist mask 124. More specifically, an etching technique may be used to remove the first dielectric layer 106 from within the first opening 120 selective to the BOX layer 142 and the fin 102. In one embodiment, isotropic wet etching may be used to remove the first dielectric layer 106. In one embodiment, the isotropic wet etching technique may use one of the following compounds, tetra methyl ammonium hydroxide (TMAH), warm or hot ammonia, or hot tetra eethyl ammonium hydroxide (TEMH). In one embodiment, the isotropic wet etching technique may use ammonium hydroxide. In one embodiment, for example, reactive ion etching (RIE) may be used to remove the first dielectric layer 106 from within the first opening 120. Therefore, the removal technique described above removes the first dielectric layer 106 only from within the first opening 120 and not from within the second opening 122, FIG. 7. Therefore, the first dielectric layer 106 remains within the second opening 122, FIG. 7 and on top of the second fin 104 of the I/O device after the removal process described above.

Removal of the first dielectric layer 106 from within the first opening 120 exposes the BOX layer 142 and first fin 102 within that opening. The surface of the BOX 142 layer and the first fin 102 remain undamaged throughout the removal process because the etching technique may be limited to remove on the deposited thickness of the first dielectric layer 106. This is possible because the first dielectric layer 106 may be deposited conformal to the surface geometry of the BOX layer 142 and the first fin 102 and have a constant thickness.

FIGS. 11, 12, and 13 each depict a cross-sectional view of FIG. 10. Cross section C-C is depicted in FIG. 11. Cross section D-D is depicted in FIG. 12. Cross section E-E is depicted in FIG. 13. Referring to FIGS. 11, 12 and 13, the first dielectric layer 106 is shown conformal to the BOX layer 142 and the second fin 104 within the second opening 122, FIG. 7. The first dielectric layer 106 is no longer shown conformal to the BOX layer 142 and the first fin 102 within the first opening 120. Therefore the first dielectric layer 106 remains deposited conformal to the second fin 104 of the I/O finFET device and no longer exists on top of the first fin 102 of the high performance device.

Figure 14:
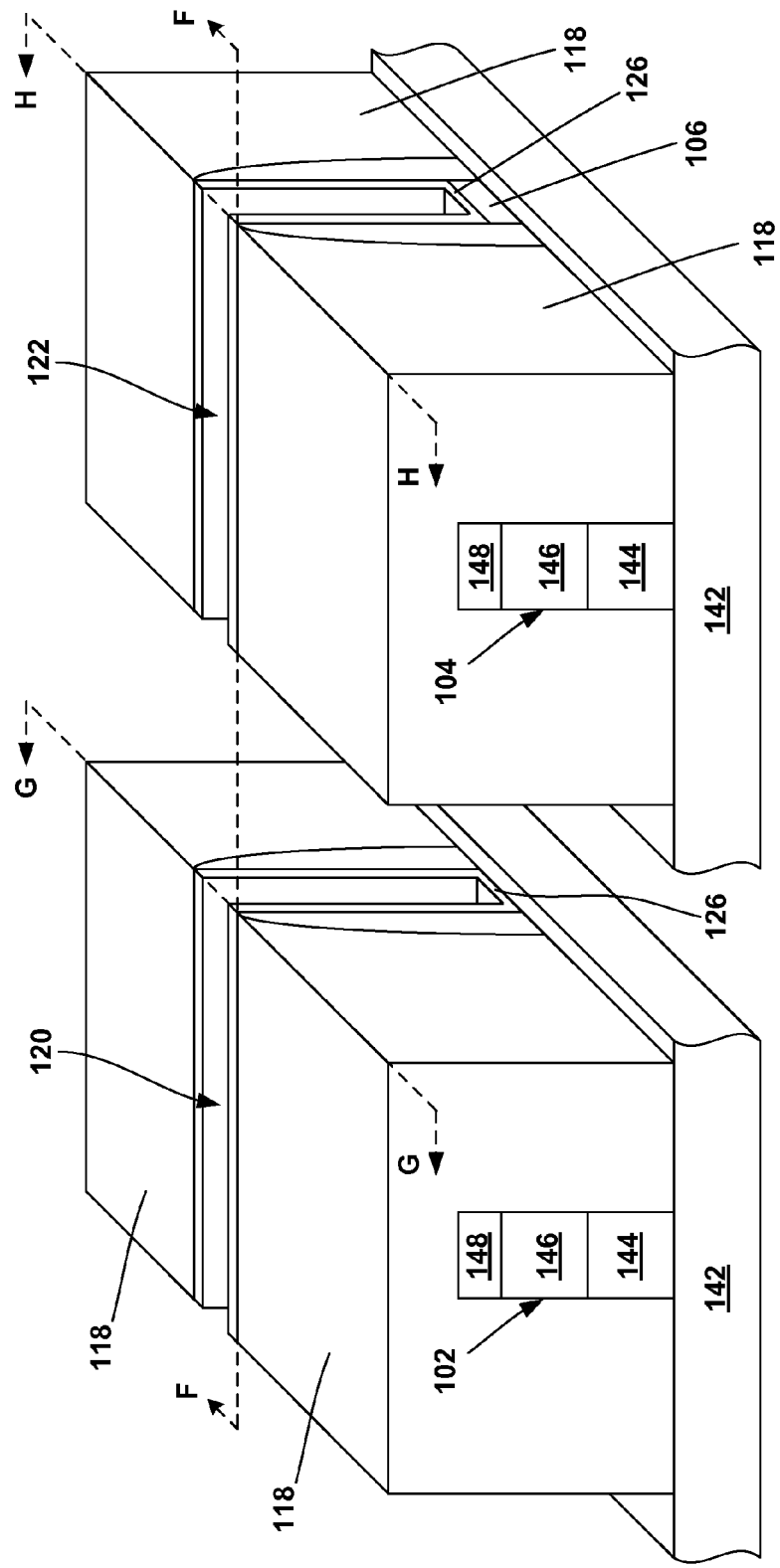

Referring now to FIG. 14, a second dielectric layer 126 may be deposited conformal to the surface of the SOI substrate 140 and the first fin 102 within the first opening 120, and conformal to the first dielectric layer 106 within the second opening 122. In one embodiment, the second dielectric layer 126 may include, but is not limited to, a material made from hafnium silicate (HfSiO$_x$), hafnium oxide (HfO$_2$), zirconium silicate (ZrSiO$_x$), zirconium oxide (ZrO$_2$), silicon nitride (Si$_3$N$_4$), silicon oxynitride (SiON), or other high-k material (greater than 4.0) or any combination of these materials. In one embodiment, the second dielectric layer 126 may include silicon oxide (SiO$_2$) deposited using an atomic layer deposition (ALD) technique. The second dielectric layer 126 may have a thickness ranging from about 8 Å to 20 Å, although a thickness of the second dielectric layer 126 less than 8 Å or greater than 20 Å is acceptable.

FIGS. 15, 16, and 17 each depict a cross-sectional view of FIG. 14. Cross section F-F is depicted in FIG. 15. Cross section G-G is depicted in FIG. 16. Cross section H-H is depicted in FIG. 17. Referring to FIGS. 15, 16 and 17, the second dielectric layer 126 is shown conformal to the SOI substrate 140 and the first fin 102 within the first opening 120, and conformal to the first dielectric layer 106 within the second opening 122. Therefore, the second dielectric layer 126 may serve as the gate oxide for the high performance device and both the first dielectric layer 106 and the second dielectric layer 126 may serve as the gate oxide for the I/O device.

Figure 18:
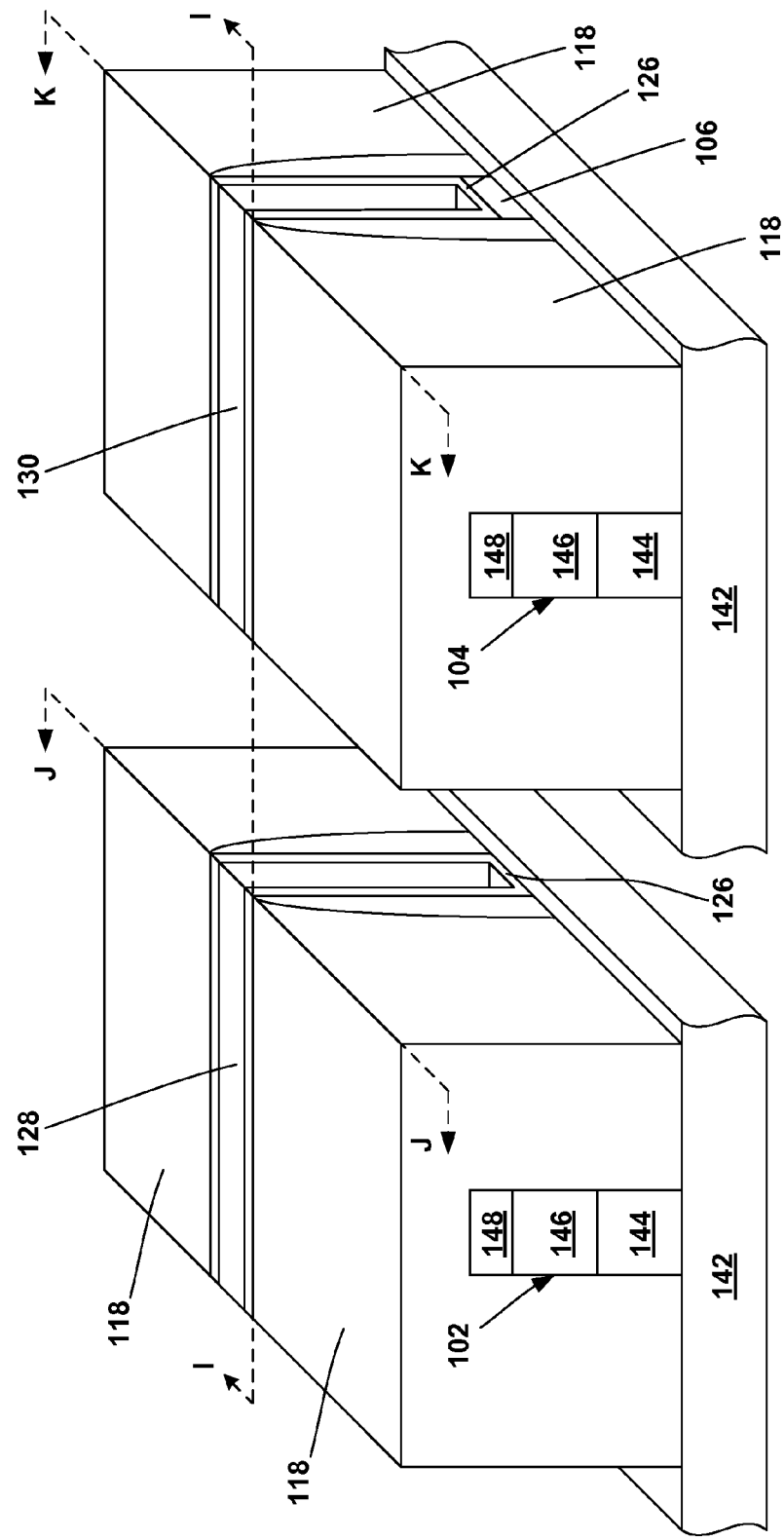
Figure 22:
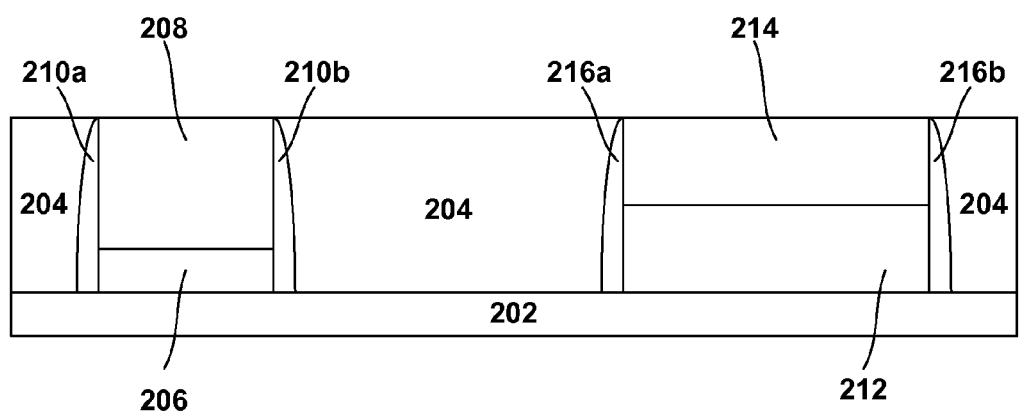
FIG. 22 is a cross-sectional side view diagram of a conventional semiconductor structure with two planar FET devices each having different thickness gate oxides.

Referring now to FIG. 18, a first gate terminal 128 and a second gate terminal 130 may be deposited. The formation of the gate terminals 128, 130 may include any now known or later developed replacement gate techniques. The first gate terminal 128 and the second gate terminal 130 may include any work function metal, seal metal, or low resistance bulk metal fill appropriate for the finFET device to be created. For example, materials such as aluminum, titanium nitride (TiN) ruthenium (Ru), titanium aluminum (TiAl), tantalum nitride (TaN), or tantalum carbide (TaC) may be used. Although shown as a single metal deposition, it is understood that multiple metal depositions using appropriate masking techniques may be employed to provide the appropriate metal over the correct areas. In one embodiment, a high-k layer may be deposited on top of the gate oxides before depositing the gate terminals. Finally, a CMP process may be used to remove excess metal deposited on the top surface of the ILD 118 during the formation of the first gate terminal 128 and the second gate terminal 130.

FIGS. 19, 20, and 21 each depict a cross-sectional view of FIG. 18. Cross section I-I is depicted in FIG. 19. Cross section J-J is depicted in FIG. 20. Cross section K-K is depicted in FIG. 21. Referring to FIGS. 19, 20 and 21, the first gate terminal 128 is shown on top of the second dielectric layer 126 above the first fin 102, and the second gate terminal 130 is shown on top of the second dielectric layer 126 above the first dielectric layer 106 and the second fin 104. Therefore, the first gate terminal 128 may serve as the gate terminal for the high performance device and the second gate terminal 130 may serve as the gate terminal for the I/O device.

Without reference to a particular drawing or set of drawings one variation of the above process is described below. In one embodiment, the sacrificial layer 107 may be deposited on top of the first and second fins 102, 104 followed by a CMP technique to smooth the top surface of the sacrificial layer 107. Next, the first dummy gate 110 and the second dummy gate 112 may be formed from the sacrificial layer 107 using conventional photolithography techniques. The spacers 114a, 114b, 116a, 116b may then be formed on opposite sides of the dummy gates 110, 112. Next, the ILD material 118 may be deposited on top of the SOI substrate, the first fin 102, the second fin 104, the first pair of spacers 114a, 114b, and the second pair of spacers 116a, 116b. A CMP technique may be used to smooth the top surface of the ILD material 118, the first dummy gate 110, and the second dummy gate 112. The dummy gates 110, 112 may then be removed selective to the second dielectric layer 126 crating the openings 120, 122.

Next, a resist mask (not shown) may be applied above the first fin 102 and the first dielectric layer 106 may be deposited conformal to the surface of the SOI substrate and the second fin 104, but only within the opening 122. The resist mark may then be removed and another resist mask (not shown) may be deposited directly on top of the first dielectric 106 layer formed over the second fin 104. Next, the second dielectric layer 126 may be deposited conformal to the surface of the SOI substrate and the first fin 102, but only within the opening 120. After the another resist mask is removed, gate terminals 128, 130 may then be formed within the openings 120, 122, and on top of the first dielectric layer 106 and the second dielectric layer 126.

Without reference to a particular drawing or set of drawings one variation of the above process is described below. In one embodiment, the first dielectric layer 106 may be deposited conformal to the surface of the SOI substrate, the first fin 102, and the second fin 104. Next, a second resist mask 124 may be deposited directly on top of the first dielectric 106 layer formed over the second fin 104. The second resist mask 124 may not be deposited on top of the first dielectric layer 106 formed over the first fin 102. The first dielectric layer 106 may then be removed from atop the first fin 102. Next, the second dielectric layer 126 may be deposited on top of the first fin 102 and on top of the first dielectric layer 106. The sacrificial layer 107 may then be deposited on top of the second dielectric layer 126 followed by a CMP technique to smooth the top surface of the sacrificial layer 107.

Next, the first dummy gate 110 and the second dummy gate 112 may be formed from the sacrificial layer 107 using conventional photolithography techniques. The spacers 114a, 114b, 116a, 116b may then be formed on opposite sides of the dummy gates 110, 112. Next, the ILD material 118 may be deposited on top of the SOI substrate, the first fin 102, the second fin 104, the first pair of spacers 114a, 114b, and the second pair of spacers 116a, 116b. A CMP technique may be used to smooth the top surface of the ILD material 118, the first dummy gate 110, and the second dummy gate 112. The dummy gates 110, 112 may then be removed selective to the second dielectric layer 126 crating the openings 120, 122. Next, gate terminals 128, 130 may be formed within the openings 120, 122.

Without reference to a particular drawing or set of drawings one variation of the above process is described below. In one embodiment, a thin barrier layer can be deposited on to the surface of the SOI substrate, the first fin 102, and the second fin 104. The thin barrier layer may be made from a material that will allow for easy removal of the sacrificial layer without causing damage to the underlying substrate. In one embodiment, the thin barrier layer may be made from an oxide or a nitride. Next, the sacrificial layer 107 may be deposited on top of the thin barrier layer followed by a CMP technique to smooth the top surface of the sacrificial layer 107. Next, the first dummy gate 110 and the second dummy gate 112 may be formed from the sacrificial layer 107 using conventional photolithography techniques. The spacers 114a, 114b, 116a, 116b may then be formed on opposite sides of the dummy gates 110, 112. Next, the ILD material 118 may be deposited on top of the SOI substrate, the first fin 102, the second fin 104, the first pair of spacers 114a, 114b, and the second pair of spacers 116a, 116b. A CMP technique may be used to smooth the top surface of the ILD material 118, the first dummy gate 110, and the second dummy gate 112. The dummy gates 110, 112 may then be removed selective to the thin barrier layer crating the openings 120, 122.

Next, the first dielectric layer 106 may be deposited conformal to the surface of the SOI substrate, the first fin 102, and the second fin 104, but only within the openings 120, 122. A second resist mask 124 may be deposited directly on top of the first dielectric 106 layer formed over the second fin 104. The resist mask 124 may not be deposited on top of the first dielectric layer 106 formed over the first fin 102. Next, the first dielectric layer 106 may be removed from atop the first fin 102. Next, the second dielectric layer 126 may be deposited on top of the first fin 102 and on top of the first dielectric layer 106. Gate terminals 128, 130 may then be formed within the openings 120, 122.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of manufacturing a semiconductor structure comprising multiple finFET devices each comprising different thickness gate oxides and formed in a semiconductor substrate, the method comprising:
   depositing a first dielectric layer on top of the semiconductor substrate, on top of a first fin, and on top of a second fin;
   forming a first dummy gate stack comprising a first dummy gate located on top of a first gate oxide above the first fin, and a first pair of dielectric spacers disposed on opposite sides of the first dummy gate stack;
   forming a second dummy gate stack comprising a second dummy gate located on top of a second gate oxide above the second fin, and a second pair of dielectric spacers disposed on opposite sides of the second dummy gate stack;
   removing the first dummy gate and the second dummy gate selective to the first and second gate oxides, and creating a first opening defined by exposed sidewalls of the first pair of dielectric spacers and a second opening defined by exposed sidewalls of the second pair of dielectric spacers;
   masking a portion of the semiconductor structure comprising the second fin, and removing the first gate oxide from atop the first fin; and
   depositing a second dielectric layer within the first opening, and within the second opening, the second dielectric layer being located on top of the first fin and adjacent to the exposed sidewalls of the first pair of dielectric spacers, the second dielectric layer being located on top of the second gate oxide and adjacent to the exposed sidewalls of the second pair of dielectric spacers.

2. The method of claim 1, further comprising:
   using the first and second fins in different types of transistors on the semiconductor substrate wherein a first type transistor comprising the second dielectric layer and a second type transistor comprising the second gate oxide and the second dielectric layer.

3. The method of claim 2, wherein the first type transistor is a high performance finFET device and the second type transistor is an input-output finFET device.

4. The method of claim 1, wherein the first and second gate oxides are formed from the first dielectric layer.

5. The method of claim 1, further comprising:
   using first and second the fins in a multiple-fin transistor.

6. The method of claim 1, wherein depositing the first and second dielectric layers comprises using an atomic layer deposition technique.

7. The method of claim 1, wherein removing the first and second dummy gates comprises using an isotropic wet etching technique or a reactive ion etching technique.

8. The method of claim 1, wherein depositing the first and second dielectric layers comprises depositing a high-k dielectric material.

9. The method of claim 1, further comprising:
   depositing a first gate terminal on top of the second dielectric layer above the first fin; and
   depositing a depositing a second gate terminal on top of the second dielectric layer above the second gate oxide and the second fin.

10. The method of claim 1, wherein depositing the first and second gate terminals comprises depositing polysilicon, aluminum, or tungsten.

* * * * *